United States Patent
Singer et al.

(10) Patent No.: US 9,945,526 B2
(45) Date of Patent: Apr. 17, 2018

(54) OPTOELECTRONIC LIGHTING MODULE, OPTOELECTRONIC LIGHTING APPARATUS AND VEHICLE HEADLAMP

(71) Applicant: OSRAM OPTO SEMICONDUCTORS GMBH, Regensburg (DE)

(72) Inventors: Frank Singer, Regenstauf (DE); Thomas Schwarz, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 146 days.

(21) Appl. No.: 14/764,032

(22) PCT Filed: Jan. 30, 2014

(86) PCT No.: PCT/EP2014/051788
§ 371 (c)(1),
(2) Date: Jul. 28, 2015

(87) PCT Pub. No.: WO2014/122061
PCT Pub. Date: Aug. 14, 2014

(65) Prior Publication Data
US 2016/0003436 A1    Jan. 7, 2016

(30) Foreign Application Priority Data
Feb. 8, 2013 (DE) .......... 10 2013 101 262

(51) Int. Cl.
*F21S 8/10* (2006.01)
*H01L 25/075* (2006.01)
(Continued)

(52) U.S. Cl.
CPC ....... *F21S 48/1109* (2013.01); *F21S 48/1154* (2013.01); *F21S 48/328* (2013.01);
(Continued)

(58) Field of Classification Search
CPC combination set(s) only.
See application file for complete search history.

(56) References Cited

U.S. PATENT DOCUMENTS

2002/0000056 A1   1/2002  Tsuji
2008/0019108 A1*  1/2008  Hoyer ............... H01L 23/3675
                                                361/760
(Continued)

FOREIGN PATENT DOCUMENTS

CN       102484195       5/2012
DE    10 2008 045 925    3/2010
(Continued)

OTHER PUBLICATIONS

Search Report dated Mar. 14, 2017 which issued in the corresponding Chinese Patent Application No. 2014800077656.

*Primary Examiner* — Ratisha Mehta
(74) *Attorney, Agent, or Firm* — Cozen O'Connor

(57) ABSTRACT

An optoelectronic lighting module (100) is provided having at least two optoelectronic semiconductor chips (10) with a radiation outlet surface (11) and an electrically non-conductive back side (12) facing away from the radiation outlet surface,—a cooling body (20) with a cooling body top side (21) and a cooling body bottom side (22) facing away from the cooling body top side (21),—two contact strips (30) with a contact top side (31) and a contact bottom side (32) facing away from the contact top side (31), wherein—the optoelectronic semiconductor chips (10) are arranged with the electrically non-conductive back side (12) on the cooling body top side (21),—each optoelectronic semiconductor chip (10) comprises two electric contact points (13) formed in the direction of the radiation outlet surface (11), and—the optoelectronic semiconductor chips (10) are connected in series via the electric contact points (13).

11 Claims, 8 Drawing Sheets

(51) Int. Cl.
*F21V 29/70* (2015.01)
*F21V 23/00* (2015.01)
*H01L 33/62* (2010.01)
*H01L 33/64* (2010.01)

(52) U.S. Cl.
CPC ............ *F21V 23/002* (2013.01); *F21V 29/70* (2015.01); *H01L 25/0753* (2013.01); *H01L 33/62* (2013.01); *H01L 33/642* (2013.01); *H01L 2224/48091* (2013.01); *H01L 2224/48137* (2013.01); *H01L 2224/48247* (2013.01); *H01L 2224/48471* (2013.01); *H01L 2224/49111* (2013.01); *H01L 2924/00014* (2013.01)

(56) References Cited

U.S. PATENT DOCUMENTS

| | | | |
|---|---|---|---|
| 2008/0258162 | A1 | 10/2008 | Koung et al. |
| 2009/0250709 | A1* | 10/2009 | Chang .................. H01L 33/642 257/88 |
| 2010/0123164 | A1 | 5/2010 | Suehiro et al. |
| 2010/0230141 | A1* | 9/2010 | Yamamoto ............ H05K 3/323 174/255 |
| 2010/0230697 | A1* | 9/2010 | Kohler .................. H01L 33/483 257/98 |
| 2010/0270575 | A1* | 10/2010 | Lan ...................... H01L 25/0753 257/99 |
| 2011/0169042 | A1* | 7/2011 | Wu ........................ H01L 33/642 257/99 |
| 2011/0193109 | A1* | 8/2011 | Loh .......................... F21K 9/30 257/89 |
| 2011/0261536 | A1* | 10/2011 | Feichtinger ............ H01C 1/084 361/713 |
| 2011/0316022 | A1 | 12/2011 | Hussell |
| 2012/0007076 | A1* | 1/2012 | Cho ....................... F21S 48/115 257/48 |
| 2012/0056227 | A1* | 3/2012 | Lee ........................ H01L 33/486 257/98 |
| 2012/0080674 | A1 | 4/2012 | Shimizu et al. |
| 2012/0112337 | A1 | 5/2012 | Groetsch et al. |
| 2012/0126255 | A1 | 5/2012 | Hussell et al. |

FOREIGN PATENT DOCUMENTS

| | | |
|---|---|---|
| DE | 10 2008 063 325 | 7/2010 |
| EP | 2 492 983 | 8/2012 |
| JP | 2001-332771 | 11/2001 |
| JP | 2010-045167 | 2/2010 |
| JP | 2012-502453 | 1/2012 |
| JP | 2012-054561 | 3/2012 |
| WO | WO 2012/016760 | 2/2012 |
| WO | WO 2012/095931 | 7/2012 |

* cited by examiner

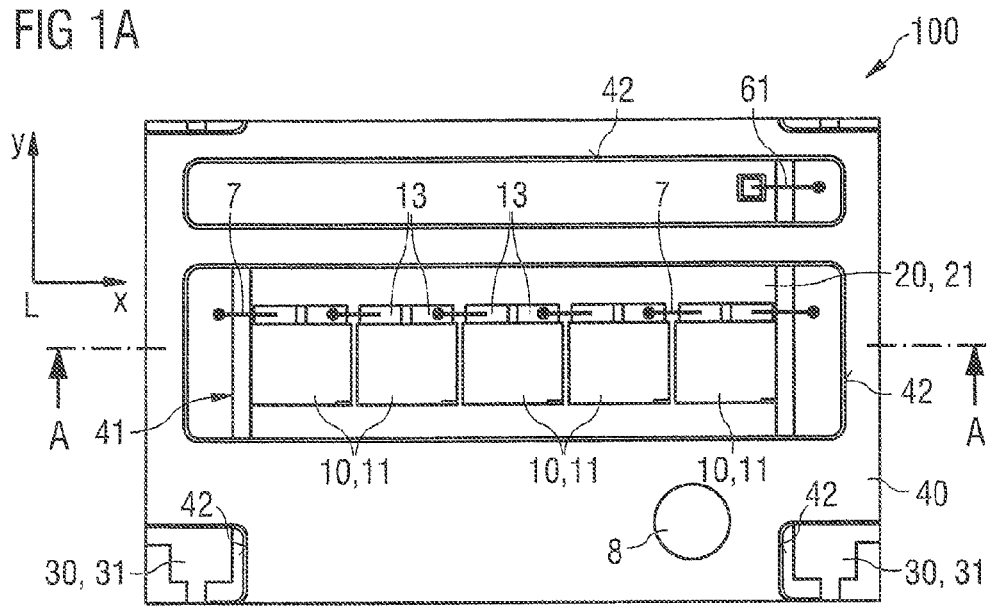
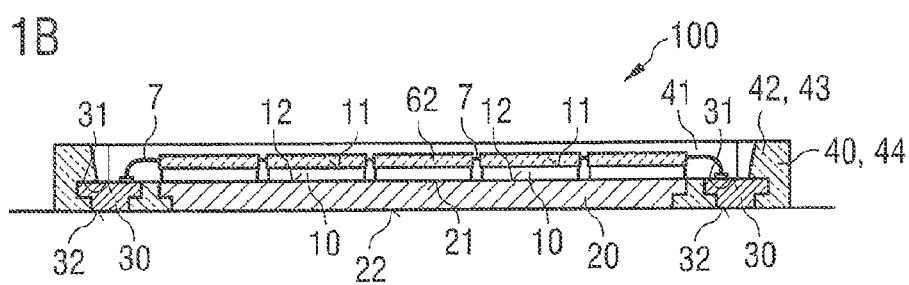
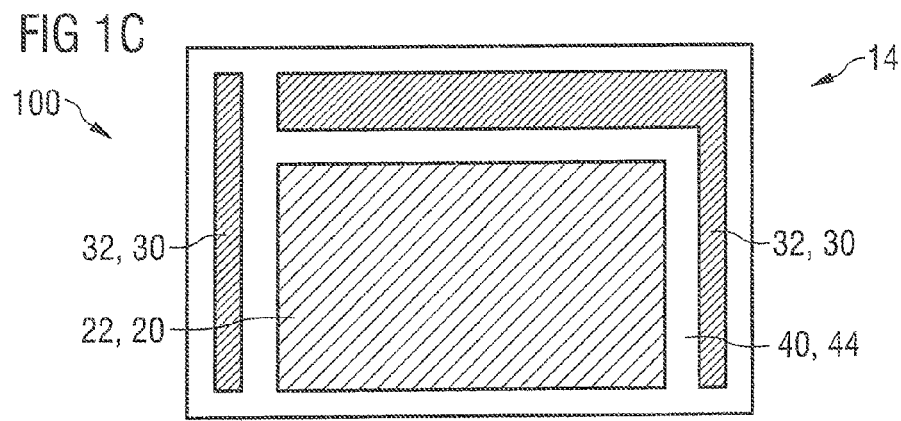

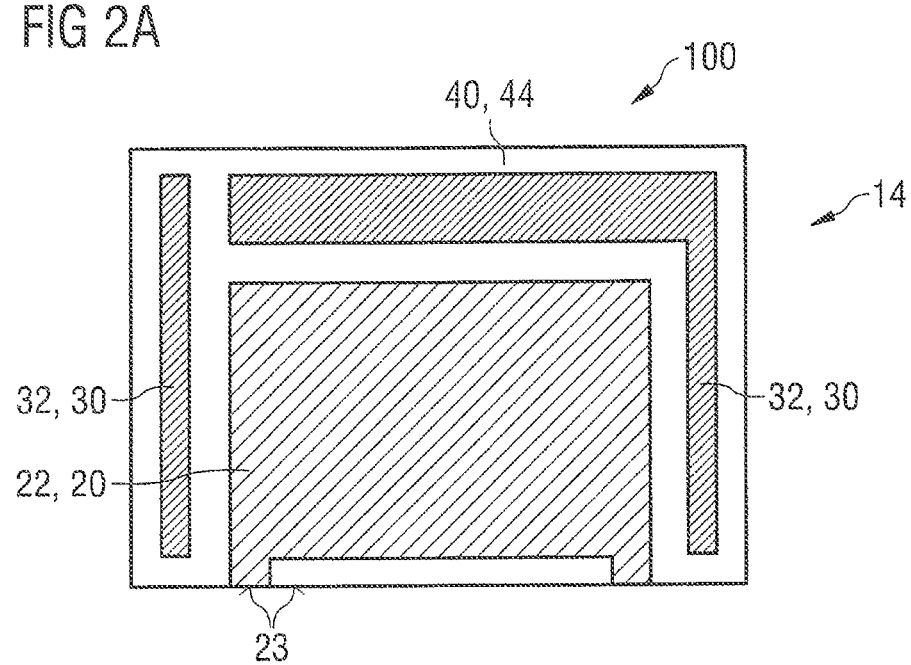
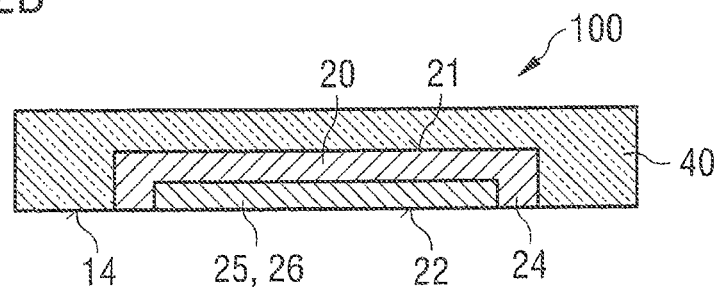

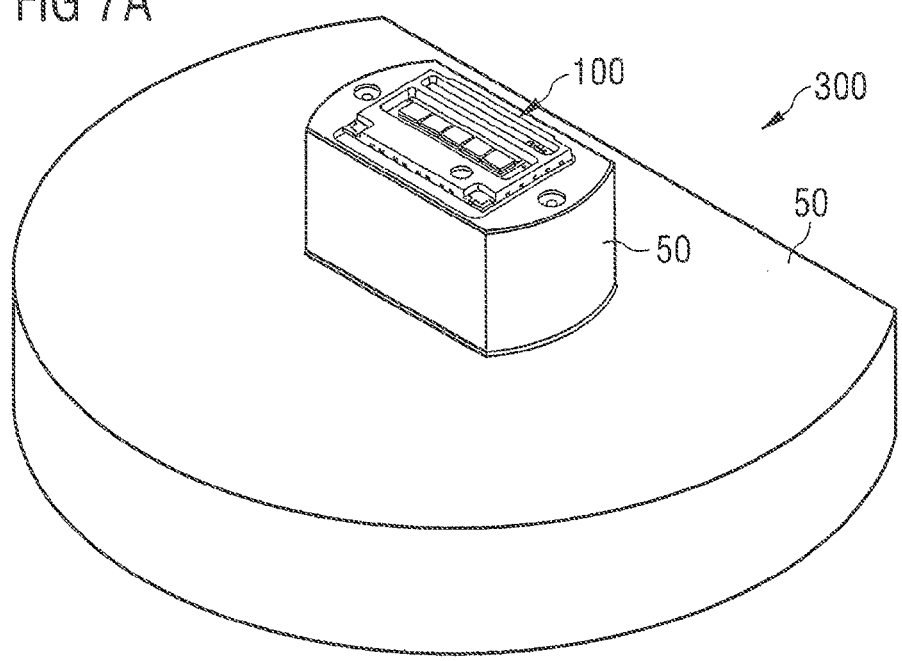
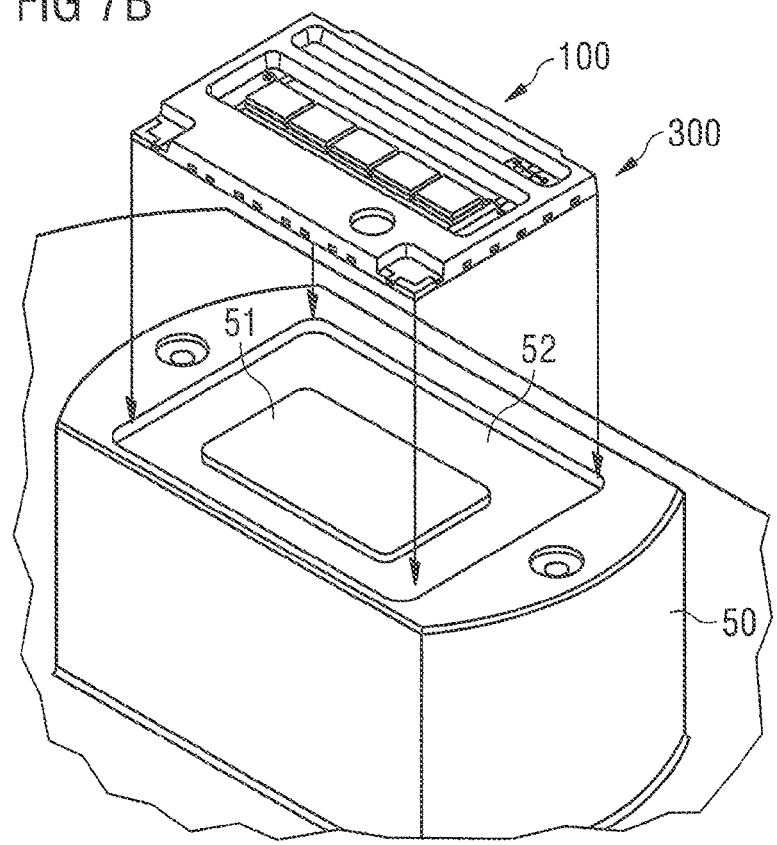

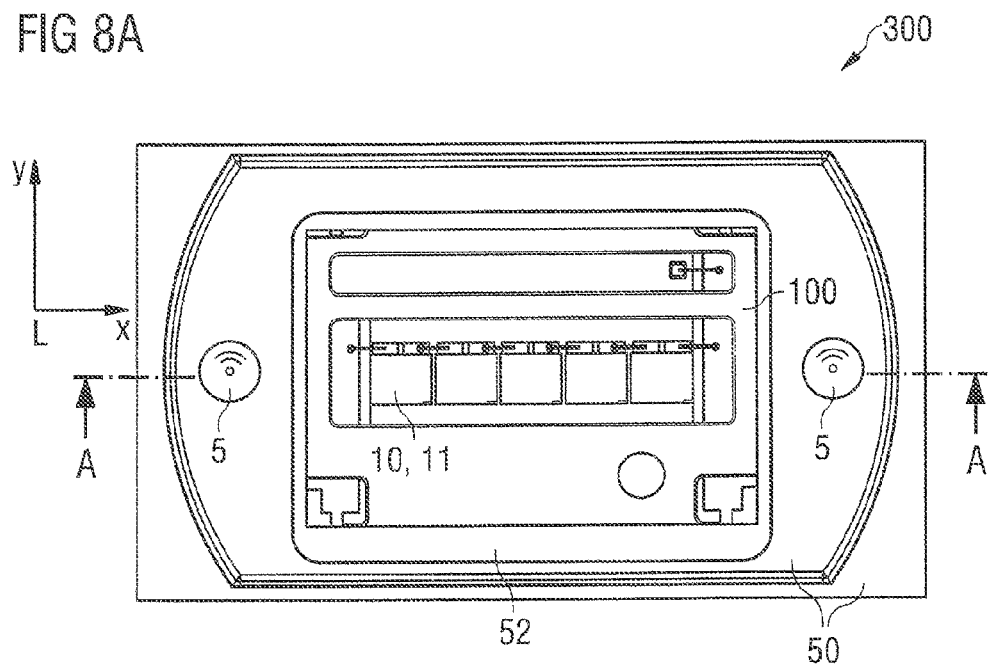
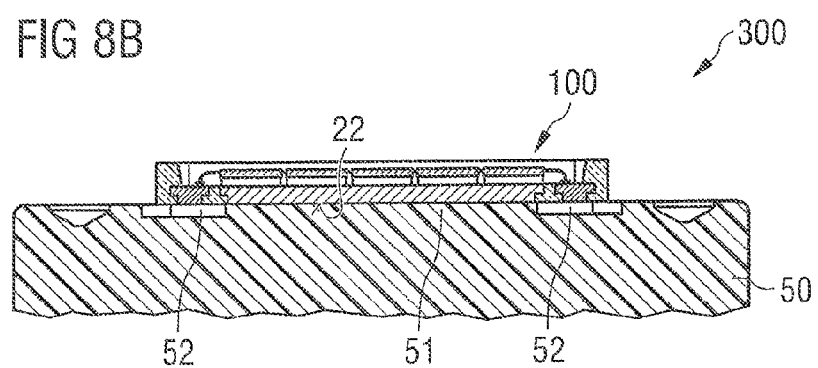

OPTOELECTRONIC LIGHTING MODULE, OPTOELECTRONIC LIGHTING APPARATUS AND VEHICLE HEADLAMP

RELATED APPLICATIONS

This is a U.S. National Phase Application under 35 USC 371 of International Application PCT/EP 2014/051788 filed on Jan. 30, 2014.

This application claims the priority of German application no. 10 2013 101 262.0 filed Feb. 8, 2013, the entire content of which is hereby incorporated by reference.

FIELD OF THE INVENTION

An optoelectronic lighting module is provided. Furthermore, an optoelectronic lighting apparatus is provided with an optoelectronic lighting module of this type. Finally, a vehicle headlamp with such an optoelectronic lighting module is provided.

SUMMARY OF THE INVENTION

An object which is to be achieved is to provide an optoelectronic lighting module which can dissipate heat in a particularly efficient manner.

According to at least one embodiment of the optoelectronic lighting module comprises at least two optoelectronic semiconductor chips having a radiation outlet surface and an electrically non-conductive back side facing away from the radiation outlet surface. During operation, electromagnetic radiation, in particular light, exits the radiation outlet surface. The optoelectronic semiconductor chip is, for example, a light-emitting diode. The light-emitting diode can be suitable in particular for the production of blue light, white light or infrared radiation.

A semiconductor layer sequence of the optoelectronic semiconductor chip can be based on a III-V compound semiconductor material. The III-V compound semiconductor material can include, for example, GaN, InGaN, AlGaN or InAlGaN.

The radiation outlet surface of the optoelectronic semiconductor chip extends perpendicular and/or transverse to a growth direction of the semiconductor layer sequence of the optoelectronic semiconductor chip. A lateral direction extends, for example, in parallel with the radiation outlet surface.

The back side facing away from the radiation outlet surface is not embodied electrically conductive and can extend in parallel with the radiation outlet surface.

The at least two optoelectronic semiconductor chips are not electrically contacted via the respective back side. That is to say, the back side of each semiconductor chip is potential-free.

According to at least one embodiment of the optoelectronic lighting module, this module comprises a cooling body having a cooling body top side and a cooling body bottom side facing away from the cooling body top side. The cooling body serves in particular to dissipate heat produced during operation by the optoelectronic semiconductor chip. For example, the cooling body is based on a metal which conducts heat well, for example, copper or aluminium, or a metal alloy. In other words, the cooling body is a heat sink which is an integral component of the optoelectronic lighting module. The cooling body top side faces the at least two optoelectronic semiconductor chips and the cooling body bottom side faces away from the optoelectronic semiconductor chips. For example, the cooling body top side of the cooling body is provided for arrangement of the at least two optoelectronic semiconductor chips on the cooling body top side of the cooling body.

According to at least one embodiment of the optoelectronic lighting module, this module comprises two contact strips having a contact top side and a contact bottom side facing away from the contact top side. The contact strips comprise an electrically conductive material. The electrically conductive material can be or comprise, for example, copper. The contact top side of the two contact strips faces in the direction of the radiation outlet surface of the at least two optoelectronic semiconductor chips and the contact bottom side faces in a direction opposite to the radiation outlet surface. The two contact strips are integral components of the optoelectronic lighting module. The two contact strips can be layers which can be soldered, consisting of, for example, NiAu or NiPdAu.

According to at least one embodiment of the optoelectronic lighting module, the optoelectronic semiconductor chips are arranged with the electrically non-conductive back side on the cooling body top side. That is to say that the electrically non-conductive back side is in direct contact with the cooling body top side. For example, the optoelectronic semiconductor chips are durably attached with the back side to the cooling body top side in a non-reversibly releasable manner. In other words, the optoelectronic semiconductor chips are in thermal contact with the cooling body via the cooling body top side of the cooling body, wherein, by reason of the electrically non-conductive back side, electric contact via the cooling body itself does not take place.

According to at least one embodiment of the optoelectronic lighting module, each optoelectronic semiconductor chip has two electric contact points formed in the direction of the radiation outlet surface. The two electric contact points of each optoelectronic semiconductor chip have, in particular, different polarities. In other words, each optoelectronic semiconductor chip is electrically contacted via surface contact. "Surface contact" should be understood in the present context to mean electric contact which takes place on the radiation outlet surface of the semiconductor chip.

According to at least one embodiment of the optoelectronic lighting module, the optoelectronic semiconductor chips are connected in series via the electric contact points. In other words, the individual actuation of the optoelectronic semiconductor chips within the optoelectronic lighting module is not possible. That is to say, the optoelectronic semiconductor chips all produce electromagnetic radiation at the same time during operation.

The optoelectronic semiconductor chips can have a radiation outlet surface of, for example, 0.25 mm$^2$ or 1 mm$^2$ or more, wherein a spacing between the at least two semiconductor chips is greater than 20 µm, for example 100 µm. Depending on the application, the spacing between the at least two semiconductor chips is dependent on the desired, necessary and/or preset homogeneous light density which the optoelectronic lighting module should have.

According to at least one embodiment of the optoelectronic lighting module the two contact strips are spaced apart from the cooling body in the lateral direction. In other words, the two contact strips are located laterally spaced apart from the cooling body and can frame this cooling body in particular at least in places, wherein in this case the cooling body functions as a reference component.

According to at least one embodiment of the optoelectronic lighting module, the contact top sides and the contact bottom sides of the two contact strips are free at least in places. That is to say that the contact top sides and the contact bottom sides of the two contact strips have regions which can be contacted from the outside. For example, the contact top side can have surfaces which can be soldered at least in places and which can be provided in particular for bond wire contact.

According to at least one embodiment of the optoelectronic lighting module, the cooling body bottom side forms, with the contact bottom sides of the two contact strips, a common planar surface and the cooling body bottom side is freely accessible at least in places. That is to say that the cooling body bottom side and the contact bottom sides of the two contact strips do not form a height difference with respect to one another. In other words, the cooling body bottom side forms, with the contact bottom sides of the two contact strips by means of the common planar surface, a surface which is suitable for simultaneous direct thermal and electric contact. The cooling body bottom side is thereby freely accessible and is suitable for thermal contact with, for example, a further cooling body, for example a heat sink or a thermal contact of a circuit board.

According to at least one embodiment of the optoelectronic lighting module, this module comprises at least two optoelectronic semiconductor chips with a radiation outlet surface and an electrically non-conductive back side facing away from the radiation outlet surface, a cooling body with a cooling body top side and a cooling body bottom side facing away from the cooling body top side and two contact strips with a contact top side and a contact bottom side facing away from the contact top side. The optoelectronic semiconductor chips of the optoelectronic lighting module are arranged with the electrically non-conductive back side on the cooling body top side, wherein each optoelectronic semiconductor chip has two electric contact points formed in the direction of the radiation outlet surface, and the optoelectronic semiconductor chips are connected in series via the electric contact points. The two contact strips are thereby spaced apart from the cooling body in the lateral direction, wherein the contact top sides and the contact bottom sides of the two contact strips are freely accessible at least in places and the cooling body bottom side forms, with the contact bottom sides of the two contact strips, a common planar surface, wherein the cooling body bottom side is freely accessible at least in places.

In the case of the optoelectronic lighting module described herein, in particular the idea is pursued of arranging a plurality of optoelectronic semiconductor chips on a cooling body such that the optoelectronic semiconductor chips can efficiently dissipate heat arising during operation over the cooling body. The current feed required for start-up is thereby provided in particular by separate electrically conductive contact strips not in direct contact with the cooling body. The optoelectronic semiconductor chips thus each have, on their radiation outlet surface, two electric contact points formed in the direction of the radiation outlet surface and are formed in an electrically insulating manner on the back side facing away from the radiation outlet surface.

During simultaneous thermal and electric contact of the optoelectronic semiconductor chips via a single carrier, on the one hand, in particular, rigid metal solder or, for example, epoxides with conductive materials, in particular silver, added to them are used as connecting agents. Rigid metal solder or epoxides with silver added to them are, however, unable to compensate for the stresses by means of different thermal expansion coefficients between the optoelectronic lighting module, in particular the carrier, and the circuit board.

On the other hand, comparatively soft, particularly silicone-based adhesives can be used for simultaneous thermal and electric contact, being filled, for example, with barium nitride and/or boron nitride. Furthermore, the heat conductivity of the adhesive can be increased by aluminium filler particles. However, such adhesives have only comparatively low thermal conductivity of the order of 2 W/(mK) and also have to be applied in comparatively large layer thicknesses of between 20 and 70 μm.

By means of the high thermal resistance of the connecting agent layer the heating of the optoelectronic lighting module is therefore significantly reduced. Furthermore, a build-up process with respect to an electrically conductive and thermally conductive carrier on which the optoelectronic semiconductor chips are arranged is highly complex and does not take place as in the case of a pre-mould package in an inline manufacturing concept.

By means of the two contact strips described herein, which are not in contact with the cooling body in the lateral direction, the thermal and electric connections are separated from one another. In other words, in particular, adaptation, matching and/or adjustment of different thermal expansion coefficients is not required. This is especially possible since during operation of the optoelectronic lighting module, the contact strips are less strongly heated and the resulting heat can be dissipated over the cooling body.

According to at least one embodiment of the optoelectronic lighting module, the cooling body and the two contact strips are embedded in a housing body made from an electrically insulating material. For example, the housing body comprises an electrically insulating material which includes a ceramic, for example, aluminium nitride (AlN) or silicon nitride (SiN) or consists of one of these materials. The electrically insulating material can also comprise thermosetting plastic such as, for example, silicones and epoxides. Furthermore, thermoplastics, for example, PPA, PET, PBT and PCT are possible. The cooling body and the two contact strips are spaced apart from one another by the electrically insulating material and are not in contact with one another.

According to at least one embodiment of the optoelectronic lighting module, the cooling body top side and the contact top side are at least in places free from the electrically insulating material in a recess of the housing body. For example, prior to embedding the cooling body and the two contact strips, a tool and/or a mould part is arranged on the cooling body top side and at least in places on the contact top side and so, after embedding, there is no electrically insulating material of the housing body on the cooling body top side and the contact top side. In other words, the housing body comprises openings and/or indentations which make it possible to contact the cooling body top side and the contact top side from the outside. For example, the cooling body top side can be fitted with the optoelectronic semiconductor chips via the recess and the optoelectronic semiconductor chips are connected in series over the contact top side of the two contact strips.

According to at least one embodiment of the optoelectronic lighting module, the housing body can comprise further recesses. For example, a first recess for arrangement of the optoelectronic semiconductor chips on the cooling body top side can be provided, wherein the electric contact is effected via the contact top side of the two contact strips.

A second recess can be provided, for example, in order to form an ESD diode, wherein the ESD diode connects the two contact strips to one another. A third and a fourth recess can be formed in such a way that corner regions of the housing body are free in such a way that an electric connection to a circuit board, in particular a metal core board, can be formed on the contact top sides of the two contact strips.

According to at least one embodiment of the optoelectronic lighting module, at least one side wall defines the recess of the housing body in the lateral direction, wherein the side wall comprises a radiation-reflecting filler material and the electrically insulating material of the housing body surrounding the cooling body and the two contact strips in the lateral direction comprises a radiation-absorbing filler material. That is to say that the housing body described herein can have radiation-reflecting properties and radiation-absorbing properties.

The recess can be surrounded, for example, by two or four side walls. If the recess has four side walls, the recess can be formed in a trough shape. That is to say, the recess is laterally defined throughout by the side wall. If the recess has two side walls, the recess can be located in the corner regions of the housing body. The side walls are thereby formed from the electrically insulating material, wherein these can comprise the radiation-reflecting filler material. For example, the electrically insulating material of the housing body can be a silicone and the radiation-reflecting filler material can comprise dielectric particles, for example, TiO. The electrically insulating material surrounding the cooling body and the two contact strips in the lateral direction can in turn comprise silicone, wherein the radiation-absorbing filler material can comprise particles of carbon black.

A filling level with respect to the radiation-reflecting and/or radiation-absorbing filler materials can in particular influence the optical crosstalk or the smearing of the electromagnetic radiation of the optoelectronic semiconductor chips, which is produced during operation.

According to at least one embodiment of the optoelectronic lighting module, the cooling body forms, with the housing body, an exposed side surface, wherein the exposed side surface extends transversely with respect to the common planar surface. The exposed side surface extends from the bottom side to a top side, facing away from the bottom side, of the optoelectronic lighting module and connects the top side to the bottom side. The bottom side is thereby defined by the common planar surface of the lighting module. In other words, the exposed side surface terminates flush with the common planar surface of the lighting module and therefore also comprises the cooling body bottom side of the cooling body. "Exposed side surface" is understood to mean in the present context a side surface of the optoelectronic lighting module which is accessible from the outside and is freely visible to an external observer. "Freely visible" is understood to mean in the present context that the exposed side surface can be checked visually from the outside.

According to at least one embodiment of the optoelectronic lighting module, the cooling body has a first region and a second region on the exposed side surface, wherein the first region is formed as an indentation in the cooling body, the second region is formed within the first region and is coated with an attachment material and the attachment material of the second region can be more strongly wetted with connecting material than the first region.

The first region can be formed, for example, by a chemical process, for example, etching, into the exposed side surface of the cooling body. The first region extends at least in places from the common planar surface in the direction of the cooling body top side. The second region is formed within the first region and adjoins at least in places the common planar surface of the lighting module. The attachment material can comprise, for example, an NiPdAu alloy or consist thereof.

The attachment material of the second region can therefore be wetted better for the connecting material than the first region of the cooling body which is not coated with the attachment material. The connecting material can comprise in particular a solder material. By means of the first and second regions formed in the exposed side surface, in particular a visual check with respect to thermal contact by means of a solder material is possible since in particular the solder material can be visually detected or seen on the more strongly wettable second region.

According to at least one embodiment of the optoelectronic lighting module, the side wall of the recess of the housing body protrudes over the radiation outlet surface of the optoelectronic semiconductor chips by at least 20 μm. That is to say that the radiation outlet surface of the optoelectronic semiconductor chips does not protrude over the side wall at any point. In this way the optoelectronic lighting module can be mechanically contacted, at an upper edge of the side wall which extends in parallel and spaced apart from the radiation outlet surface of the optoelectronic semiconductor chips at a spacing of at least 20 μm, by an apparatus, for example, for arrangement on a circuit board, without coming into contact with the radiation outlet surface and therefore possibly damaging the radiation outlet surface.

Furthermore, it is feasible that by means of the structure described herein the optoelectronic semiconductor chips, which are located within the recess, can additionally be cast using a transparent, translucent and/or clear material and the radiation-permeable material terminates flush with the upper edge of the side wall. In this way the optoelectronic semiconductor chips can be protected against external influences. In particular, the lateral protrusion of the side wall of the recess with respect to the radiation outlet surface of the optoelectronic semiconductor chips contributes to it being possible for more light to be reflected on the side wall, which, as described herein, can comprise radiation-reflecting filler materials, for example, a titanium oxide.

According to at least one embodiment of the optoelectronic lighting module, at least one of the contact strips encompasses the cooling body in the lateral direction at least in places and is spaced apart from the second contact strip by at least 100 μm. By means of the spacing of at least 100 μm as described herein, the mounting, attachment and/or adjustment of an external ESD diode can easily be achieved by manufacturing technology, since only small physical spaces need to be bridged. By means of the spacing described herein, a stable ESD diode can be mounted, attached and/or adjusted. In particular, no optoelectronic semiconductor chips with integrated ESD protection are required. Furthermore, the spacing described herein permits a compact construction of the optoelectronic lighting module described herein without having to resort to complex-structured optoelectronic semiconductor chips with integrated ESD protection.

According to at least one embodiment of the optoelectronic lighting module, the optoelectronic semiconductor chips each have a substrate and a semiconductor layer sequence, wherein the substrate can comprise a substrate material consisting of AlN, SiN, $Al_2O_3$ ceramic, Ge, undoped Si and/or sapphire or consists of one of these substrate materials, and the substrate forms at least in places the electrically non-conductive back side. The substrate can be, for example, electrically insulating. The substrate can be formed in particular in a radiation-permeable or radiation-impermeable manner. The substrate can be a growth substrate or a substrate different from a growth substrate. For example, a reflecting layer can be arranged between the substrate and the semiconductor layer sequence. In particular, the reflecting layer can comprise a metal layer, for example a silver layer. The reflecting layer can comprise the same lateral expansion as the substrate or the semiconductor layer sequence of the optoelectronic semiconductor chip. That is to say, the reflecting layer can be formed in particular over the whole surface between the substrate and the semiconductor layer sequence of each optoelectronic semiconductor chip.

An optoelectronic lighting apparatus is provided. The optoelectronic lighting apparatus comprises an optoelectronic lighting module described herein, as described in conjunction with one or several of the embodiments mentioned herein. Features of the optoelectronic lighting apparatus are thus also disclosed for the lighting module described herein and vice versa.

According to at least one embodiment of the optoelectronic lighting apparatus, the optoelectronic lighting module is arranged on a circuit board. The circuit board is, for example, a metal core board or a printed circuit board. For example, the circuit board can be formed as an FR4 circuit board.

According to at least one embodiment of the optoelectronic lighting apparatus, the circuit board comprises a thermal contact region for thermal contact of the cooling body bottom side of the optoelectronic lighting module and the thermal contact region is completely framed in the lateral direction on all side surfaces by a solder stop layer. The solder stop layer, for example, thereby directly adjoins the thermal contact region. The solder stop layer can consist of at least one of the following materials or comprise at least one of the following materials: chromium, aluminium, silicon dioxide, aluminium oxide, platinum, nickel chromium or lacquer. The solder stop layer can be applied to the circuit board in the same manner as a metallisation.

The thermal contact region for the thermal contact of the cooling body bottom side of the optoelectronic lighting module can comprise a material which is the same as the material of the cooling body. For example, the thermal contact region can comprise an aluminium or a copper or consist of an alloy thereof. Therefore, an optimal adaptation of the thermal expansion coefficients is produced which is in particular especially stable against ageing and is stress-resistant.

The solder stop layer is free of solder material. By means of the solder stop layer being completely framed on all side surfaces of the thermal contact, automatic self-adjustment of the optoelectronic lighting module is possible since a solder connection can be formed only between the cooling body bottom side and the thermal contact region of the circuit board. Furthermore, by means of the first and second regions of the exposed side surface of the housing body as described herein, sufficient wetting with the solder material in particular in the second region can be checked visually. For example, the attachment material of the second region comprises the same material as the solder material.

According to at least one embodiment of the optoelectronic lighting apparatus, the cooling body bottom side is connected to the thermal contact region by a solder connection.

According to at least one embodiment of the optoelectronic lighting apparatus the contact bottom sides of the two contact strips at least in places adjoin the solder stop layer and the contact top sides of the two contact strips are electrically connected to the circuit board via two electric bridges. In other words, the contact bottom sides of the two contact strips are not in direct contact with the thermal contact region and adjoin the solder stop layer, which is formed in particular in an non-electrically conductive manner.

For external electric contact with the circuit board, in particular electric bridges, for example in the form of bond wire contacts, are provided. Current feed is then provided initially via the circuit board, wherein the bond wire contact in the form of the electric bridges described herein, conducts the current into the optoelectronic lighting module and so the optoelectronic semiconductor chips can be put into operation. The heat arising during start-up is dissipated outwards through the cooling body and the thermal contact region of the circuit board.

According to at least one embodiment of the optoelectronic lighting apparatus, the at least one electric bridge is formed from at least two, in particular exactly two, bond wires. In order to ensure stable current feed of the optoelectronic lighting module through the circuit board, in particular several bond wires are formed for connection or bridging of the current between the circuit board and the optoelectronic lighting module. It is thereby prevented that in the event of damage to a bond wire by further bond wires of the same polarity, stable current feed is ensured. For example, the electric bridges can comprise three bond wires. The electric bridge can also comprise wires and flexes which can be connected by soldering to the circuit board and to the optoelectronic lighting module.

Furthermore, a vehicle headlamp can be provided. The vehicle headlamp comprises an optoelectronic lighting module as described in conjunction with one or several of the embodiments mentioned herein. Features of the vehicle headlamp are thus also disclosed for the optoelectronic lighting module described herein and vice versa.

According to at least one embodiment of the vehicle headlamp the optoelectronic lighting module is thermally connected to the cooling body bottom side on a raised area of a heat sink, wherein regions of the heat sink which surround the raised area in a form-fit manner in the lateral direction are spaced apart from the optoelectronic lighting module. In other words, the heat sink comprises a cavity, wherein within the cavity a contact region is provided for thermal connection of the optoelectronic lighting module described herein. The contact bottom side of the two contact strips are not in direct contact with the raised area described herein and can be spaced apart from a base surface of the surrounding region. That is to say, the contact bottom side is not in contact with the heat sink described herein and the sole contact can be formed between the raised area and the cooling body bottom side.

The regions which surround the raised area in a form-fit manner in the lateral direction can comprise a material for increasing the breakdown resistance. For example, the regions are filled with an epoxide and/or polyester and terminate with a top edge of the raised area. By filling the regions with an, in particular, polymeric material the breakdown resistance can be increased or a height of the raised area can be reduced.

If the filling is not carried out, this will result in a breakdown resistance of 3 kV when the raised area has a height of 1 mm. That is to say, if an air-filled gap is formed between the contact bottom side and the region, the breakdown resistance is about 3 kV/mm. The height can be reduced to, for example, 75 µm when epoxide with a breakdown resistance of about 40 kV/mm is formed in the region. In the case of polyester with a breakdown resistance of about 100 kV/mm, the height of the raised area can be reduced in particular to 30 µm, wherein a breakdown resistance of about 3 kV/mm can be achieved.

An optoelectronic lighting module as described herein, an optoelectronic lighting apparatus and a vehicle headlamp as described herein will be explained with the aid of exemplified embodiments with the associated figures.

BRIEF DESCRIPTION OF THE DRAWINGS

Identical, similar elements or elements which act in an identical manner are provided with the same reference numerals in the figures. The figures and the size ratios of the elements with respect to each other, as illustrated in the figures, are not to be viewed as being to scale. Rather, individual elements can be illustrated excessively large for improved clarity and/or for improved understanding.

In the figures:

FIGS. 1A, 1B and 1C show schematic illustrations from different perspectives of exemplified embodiments of an optoelectronic lighting module as described herein, FIG. 2A shows a schematic illustration of a bottom side of an optoelectronic lighting module as described herein, FIG. 2B shows a schematic illustration of a side view of an optoelectronic lighting module as described herein, FIGS. 7A and 7B show schematic illustrations of a vehicle headlamp as described herein and FIGS. 8A and 8B show schematic illustrations from different perspectives of a vehicle headlamp as described herein.

DETAILED DESCRIPTION OF THE DRAWINGS

Figure 3A:
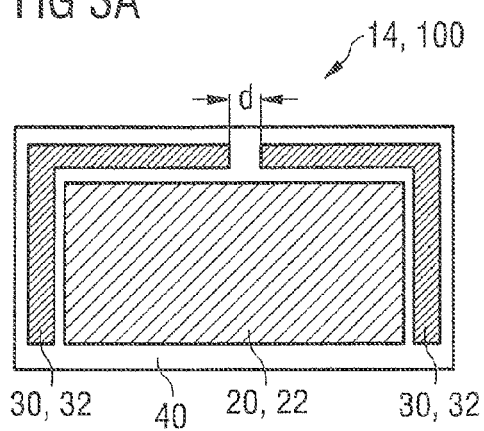
FIGS. 3A, 3B, 4A and 4B show schematic illustrations of different exemplified embodiments with the aid of a bottom side illustration of an optoelectronic lighting module as described herein.

FIG. 1A shows a schematic plan view of an exemplified embodiment of an optoelectronic lighting module. FIG. 1B shows a schematic side view of the optoelectronic lighting module along a line of cut A shown in FIG. 1A. FIG. 1C shows a bottom side of the optoelectronic lighting module.

The schematic illustration of FIG. 1A shows the optoelectronic lighting module 100 which comprises a cooling body 20, two contact strips 30 and five optoelectronic semiconductor chips 10. The five optoelectronic semiconductor chips 10 are connected in series on a cooling body top side 21 of the cooling body 20 via the contact top side 31 of the contact strips 30. Each of the optoelectronic semiconductor chips 10 has a radiation outlet surface 11 and two electric contact points 13 formed in the direction of the radiation outlet surface 11. The optoelectronic semiconductor chips 10 comprise an electrically non-conductive back side 12 (not shown herein) facing away from the radiation outlet surface.

As shown in FIG. 1A, the two contact strips 30 are spaced apart from the cooling body 20 in a lateral direction L. "Lateral" is understood in the present context to mean a positional and/or directional relationship to describe a position of the components of the lighting module which are described herein which respect to a reference component, wherein the lateral direction extends in parallel with the radiation outlet surface of the lighting module. The cooling body 20 and the two contact strips 30 are embedded in a housing body 40. The housing body 40 thereby comprises an electrically insulating material. For example, the housing body 40 comprises and/or consists of aluminium nitride or silicon nitride.

Furthermore, FIG. 1A shows recesses 41 which are formed in the housing body 40, wherein side walls 42 can laterally define the recesses 41 in the lateral direction L. Furthermore, in the corner regions of the optoelectronic lighting module 100 two recesses 41 are formed which are each defined in the lateral direction L by two side walls. Moreover, FIG. 1A shows an ESD diode 61 which connects the two contact strips 30. The contact strips are spaced apart in the lateral direction L with respect to the cooling body 20. With the aid of the recesses 41 of the housing body 40 the contact top side 31 and the cooling body top side 21 are freely accessible at least in places.

The optoelectronic lighting module 100 of FIG. 1A forms a common planar surface 14 with the cooling body bottom side 22 and the contact bottom side 32 of the two contact strips 30. The cooling body bottom side 22 and the contact bottom side 32 face away from the radiation outlet surface 11 of the optoelectronic semiconductor chips 10.

The side wall 42 defines the recess 41 of the housing body 40 in the lateral direction L. The side wall 42 can comprise, for example, a radiation-reflecting filler material 43. For example, the radiation-reflecting filler material 43 comprises a TiO. The electrically insulating material of the housing body 40 surrounding the cooling body 20 and the two contact strips 30 in the lateral direction L can comprise, for example, a radiation-absorbing filler material 44. For example, the radiation-absorbing filler material 44 comprises carbon black particles.

Furthermore, the optoelectronic lighting module 100 of FIG. 1A comprises an adjustment mark 8. The adjustment mark 8 is used in particular for orientation during arrangement on, for example, a circuit board 1 in order to ensure correct adjustment.

FIG. 1B shows a side view along the line of cut A of FIG. 1A. FIG. 1B shows the five optoelectronic semiconductor chips 10 depicted in FIG. 1A, these chips each comprise a radiation outlet surface 11 and an electrically non-conductive back side 12 facing away from the radiation outlet surface 11. In the direction of the radiation outlet surface 11 the optoelectronic chips 10 each comprise electric contact points 13 as shown in FIG. 1A. Furthermore, FIG. 1B shows the cooling body 20 with the cooling body top side 21 and a cooling body bottom side 22 facing away from the cooling body top side 21. The two contact strips 30 surrounding, encompassing and/or framing the cooling body in a spaced manner in the lateral direction L comprise the contact top side 31 and a contact bottom side 32 facing away from the contact top side 31. As shown in FIG. 1B, the optoelectronic semiconductor chips 10 adjoin the cooling body top side 21, in each case with the electrically non-conductive back side 12. That is to say, by the direct contact of the back side 12 of each optoelectronic semiconductor chip 10, the heat produced by the semiconductor chips during operation is dissipated over the cooling body 20. The contact strips 30 are thereby in electric contact with the optoelectronic semiconductor chips 10 by means of the contact top side 31 via bond wires 7.

The optoelectronic semiconductor chips 10 of FIG. 1B each have a converter element 62 on the radiation outlet surface 11. The cooling body 20 and the two contact strips 30 of FIG. 1B are embedded in a housing body 40, wherein the housing body 40 has a recess 41 in which in particular the optoelectronic semiconductor chips 10 are in direct contact with one another via the cooling body 20. Furthermore, regions of the two contact strips are freely visible and freely accessible via the recess 41 of the housing body 40. In other words, the series-connected electric contact can be visually checked via the recess 41. The cooling body bottom side 22 and the contact bottom side 32 of the contact strips 30 form the common planar surface 14.

The recess 41 of the housing body 40 protrudes over the radiation outlet surface 11 of the optoelectronic semiconductor chips 10 by at least 20 μm. The optoelectronic semiconductor chips 10, which are connected in series spaced apart from one another, have a chip-spacing of at least 20 μm with respect to one another. Furthermore, a chip spacing of 100 μm is feasible. Furthermore, larger chip spacings of up to a maximum of 1 mm are feasible. The chip spacing is to be selected large enough that during operation of the optoelectronic lighting module 100 a homogeneous light image is ensured.

FIG. 1C shows the common planar surface 14 formed by in particular the cooling body bottom side 22 of the cooling body 20 and the contact bottom side 32 of the two contact strips 30. The cooling body 20 and the two contact strips 30 are embedded in the electrically insulating material of the housing body 40. The common planar surface 14 has no height differences and/or a topography. In other words, the cooling body bottom side 22 and the contact bottom side 32 are, in the case of attachment to a further planar surface, at the same time in direct contact with the further surface and/or simultaneously adjoin the further surface.

FIG. 2A shows a schematic illustration, as shown in FIG. 1C, with the difference that the cooling body 20 forms an exposed side surface 23 with the housing body 30. The exposed side surface 23 thereby extends transverse to the common planar surface 14.

FIG. 2B shows a side view of the optoelectronic lighting module 100, wherein the exposed side surface 23 comprises a first region 24 and a second region 25. The first region 24 is, for example, formed by etching within the cooling body 20 in the form of an indentation. The second region 25 is formed within the first region 24, wherein the second region is coated with an attachment material 26. As shown in FIG. 2B, the second region 25 can be at a constant spacing to the first region, wherein the first region 24 and the second region 25 adjoin the cooling body bottom side 22 or the common planar surface 14. The attachment material 26 of the second region 25 is more strongly wettable with a connecting agent than the first region 24.

Figure 3B:
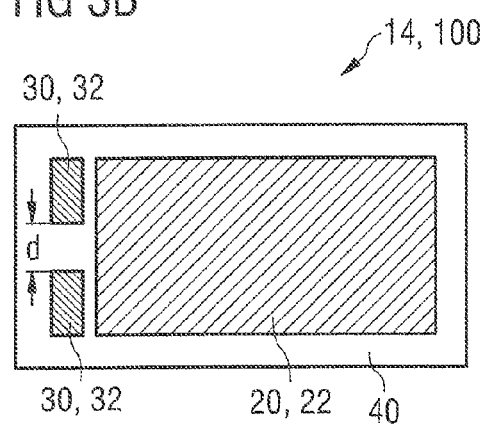

FIGS. 3A and 3B show exemplified embodiments of the common planar surface 14 of the optoelectronic lighting module 100.

FIG. 3A shows the contact strips 30 spaced apart from the cooling body 20 in the lateral direction L, wherein spacing d is formed between the contact strips 30. The spacing d can be in particular 100 μm. The two contact strips 30 are spaced apart from one another such that the formation of an ESD diode 61 which connects the two contact strips 30 to one another is ensured.

In FIG. 3A the five optoelectronic semiconductor chips 10 are connected in series with one another (not shown herein) on the cooling body top side 21. The five optoelectronic semiconductor chips 10 are arranged in a row (compare FIGS. 1A and 1B). In FIG. 3B the contact strips 30 are arranged on one side of the cooling body 20, wherein the spacing d is intended to form the ESD diode 61. In FIG. 3B, on the cooling body top side 21, the optoelectronic semiconductor chips 10 are arranged in two rows and are connected in series (not shown herein).

Figure 4A:
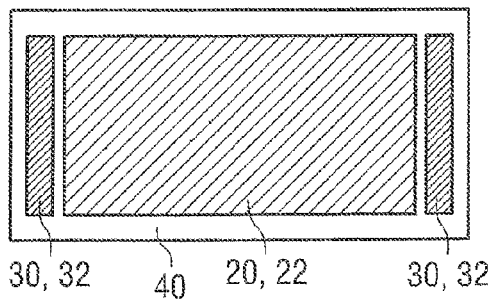
Figure 4B:
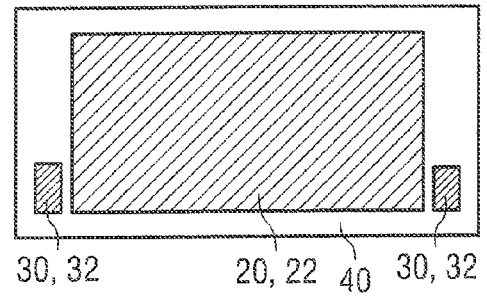

The schematic illustrations of the common planar surface 14 of the optoelectronic lighting module 100 shown in FIGS. 4A and 4B do not show any spacing d in contrast to FIGS. 3A and 3B. The arrangements shown in FIGS. 4A and 4B are feasible when the optoelectronic semiconductor chips 10 each have an integrated ESD diode 61. If the ESD diode 61 is provided in the optoelectronic semiconductor chips 10 as an integral component of the optoelectronic semiconductor chips then as shown in FIG. 4A the contact strips 30 can be arranged on two opposing end faces of the cooling body 20. FIG. 4B shows the exemplified embodiment of FIG. 4A with the difference that in contrast to FIG. 4A the contact strips 30 are formed as contact pads.

Figure 5A:
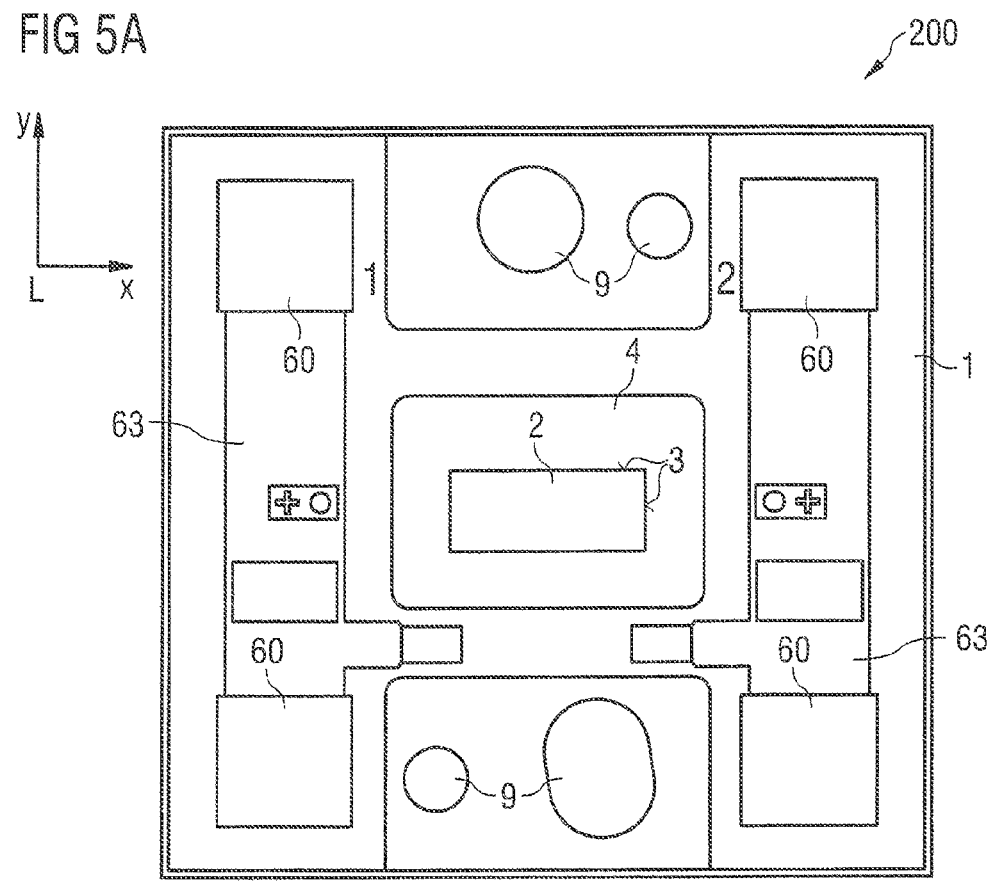
FIGS. 5A, 5B and 5C show schematic illustrations of an optoelectronic lighting module as described herein before and after arrangement of an optoelectronic lighting module as described herein on a circuit board, FIGS. 6A and 6B each show photographs from different perspectives of a vehicle headlamp as described herein.
Figure 5B:
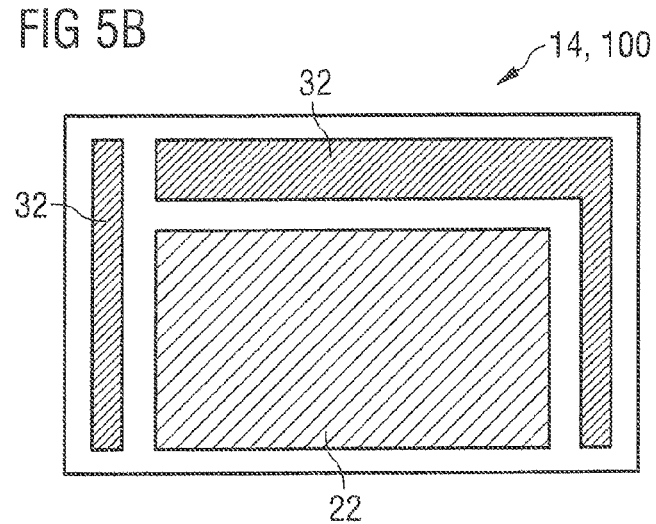

FIG. 5A shows a circuit board 1 and FIG. 5B shows the same schematic illustration as already shown in FIG. 1C. The circuit board 1 comprises a thermal contact region 2, wherein the side surfaces 3 of the thermal contact region 2 is completely framed in the lateral direction L by a solder stop layer 4. Furthermore, the circuit board 1 comprises tracks 63 with solder pads 60. The circuit board of FIG. 5A can be formed, for example, as an FR4 circuit board.

Figure 5C:
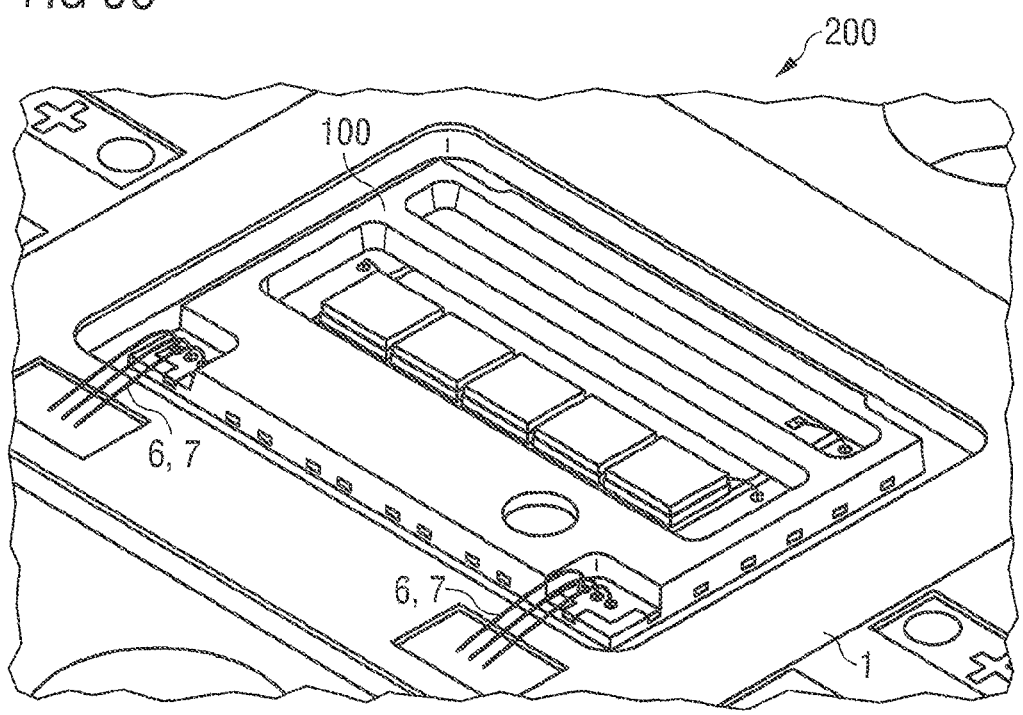

If the optoelectronic lighting module 100 having in particular the common planar surface 14 is thermally contacted with the contact region 2 of the circuit board 1, an optoelectronic lighting apparatus 200 is obtained (see FIG. 5C). That is to say, FIGS. 5A and 5B show the optoelectronic lighting apparatus 200 prior to arrangement of the optoelectronic lighting module 100 on the circuit board 1.

Furthermore, FIG. 5A shows attachment devices 9 which can be provided in the circuit board 1 in particular for the purpose of mechanical attachment. The circuit board 1 comprises the attachment devices 9 which can serve as a guide for, for example, screws, by means of which the circuit board 1 can be screwed on to a further cooling body. Solder pads 60 are disposed in each of the corner regions of the circuit board 1 and, as shown in FIG. 5A, can be formed on or in the tracks 63. In other words, the circuit board 1 is a printed metal core board.

The thermal contact region 2 of the circuit board 1 is provided for thermal contact with the cooling body bottom side 22 of the optoelectronic lighting module 100. The cooling body bottom side 22 of the optoelectronic lighting module 100 is thereby connected by, for example, a solder connection to the thermal contact region 2 of the circuit board 1. The contact bottom sides 32 of the two contact strips 30 thereby adjoin the solder stop layer 4 and the contact top sides 31 of the two contact strips 30 are electrically connected to the circuit board 1 via electric bridges 6. If the optoelectronic lighting module 100 is thermally contacted with the circuit board 1 via the cooling body bottom side 22 and the thermal contact region 2, and if the contact top side 31 of the two contact strips 30 is electrically contacted with the circuit board 1 via the two electric bridges 6 described herein, the optoelectronic lighting apparatus 200 is provided.

Therefore, FIG. 5C schematically illustrates the optoelectronic lighting apparatus 200. The two electric bridges 6 serving for electric contact thereby comprise three individual bond wires 7 which each form an electric contact between the optoelectronic lighting module 100 and the circuit board 1 or tracks 63 with solder pads 60.

Figure 6A:
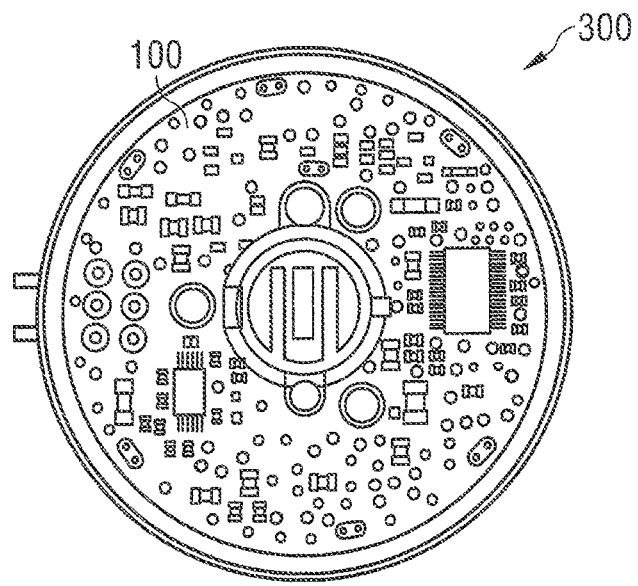
Figure 6B:
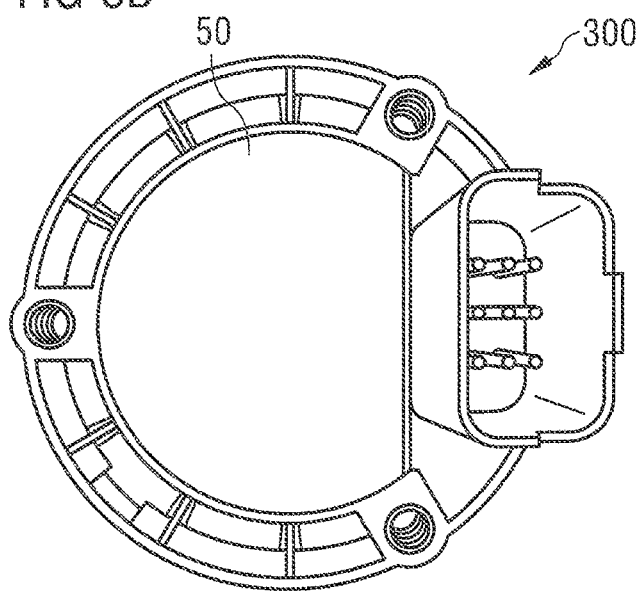

FIG. 6A and FIG. 6B show photographs of a vehicle headlamp 300, wherein the vehicle headlamp 300 comprises an optoelectronic lighting module 100 as described herein. The optoelectronic lighting module 100 is thereby disposed on a heat sink 50, as shown in a plan view in FIG. 6A and as shown from a bottom side of the vehicle headlamp 300 in FIG. 6B.

FIG. 7A shows a schematic illustration of the optoelectronic lighting module 100 which is arranged on a heat sink 50.

FIG. 7B shows a schematic illustration of the optoelectronic lighting module 100 prior to arrangement of the optoelectronic lighting module 100 on the heat sink 50 of the vehicle headlamp 300. The heat sink 50 thereby comprises a raised area 51. The raised area 51 is surrounded by regions 52 in a form-fit manner in the lateral direction L. In other words, the heat sink 50 comprises a cavity which comprises a raised area 51. The raised area 51 is provided for thermal contact with the optoelectronic lighting module via the cooling body bottom side 22. Further regions of the common planar surface 14 are not in direct contact with the heat sink. For example, an air gap can be formed between the optoelectronic lighting module 100 and the regions which surround the raised area 51 in a form-fit manner in the lateral direction L. For example, the spacing between the regions 52 of the heat sink 50 and the optoelectronic lighting module 100 is 1 mm, wherein a breakdown resistance of 3 kV is achieved.

FIG. 8A shows a schematic plan view of the vehicle headlamp 300, wherein the optoelectronic lighting module 100 is already thermally contacted on the heat sink 50 of the vehicle headlamp 300. Electric contact via the contact top sides 31 of the two contact strips 30 of the optoelectronic lighting module 100 is not shown herein. The external dimensions of the regions 52 which surround the raised area 51 in a form-fit manner in the lateral direction L as shown in FIG. 8A are not adapted to the external dimensions of the optoelectronic lighting module 100. In other words, an adjustment tolerance of the optoelectronic lighting module is provided during attachment to the heat sink 50. Furthermore, the heat sink comprises fixing points 5 which relate to the radiation outlet surfaces 11 of the optoelectronic semiconductor chips 100. The fixing points 5 serve for orientation during the thermal contact of the optoelectronic lighting module 100 on the heat sink 50.

FIG. 8B shows a side view along the line of cut A of FIG. 8A. FIG. 8B shows that the regions 52 which surround the raised area 51 in a form-fit manner in the lateral direction L are not contacted with the contact strips or contact bottom side 32, and a space or gap is formed between the heat sink 50 and the optoelectronic lighting module 100. In other words, a material-free gap is formed. The gap being formed between the optoelectronic lighting module 100 and the raised area 51 of the heat sink 50 can be filled, in particular, by polymeric materials, for example epoxide or polyester and so the breakdown resistance can be increased in particular by use of the polymeric materials instead of a physical distance.

The description made with reference to exemplified embodiments does not restrict the invention to these embodiments. Rather, the invention encompasses any new feature and any combination of features, including in particular any combination of features in the claims, even if this feature or this combination is not itself explicitly indicated in the claims or exemplified embodiments.

The invention claimed is:

1. An optoelectronic lighting module comprising:
   a housing body;
   at least two optoelectronic semiconductor chips having a radiation outlet surface and an electrically non-conductive back side facing away from the radiation outlet surface;
   a cooling body with a cooling body top side and a cooling body bottom side facing away from the cooling body top side; and
   two contact strips with a contact top side and a contact bottom side facing away from the contact top side;
   wherein the optoelectronic semiconductor chips are disposed with the electrically non-conductive back side on the cooling body top side,
   wherein each optoelectronic semiconductor chip has two electric contact points formed in the direction of the radiation outlet surface,
   wherein the optoelectronic semiconductor chips are connected in series via the electric contact points,
   wherein the two contact strips are spaced apart from the cooling body in a lateral direction,
   wherein the contact top sides and the contact bottom sides of the two contact strips are freely accessible at least in places, and
   wherein the cooling body bottom side with the contact bottom sides of the two contact strips form a common planar surface and the cooling body bottom side is freely accessible at least in places, and
   wherein the housing body comprises recesses which are arranged in corner regions of the housing body and extend to the contact strips such that the contact top sides are exposed in the recesses.

2. The optoelectronic lighting module according to claim 1, wherein the contact top sides and the contact bottom sides of the two contact strips comprise regions which can be contacted from the outside.

3. The optoelectronic lighting module according to claim 1, wherein the cooling body and the two contact strips are embedded in a housing body made from an electrically insulating material, and wherein the cooling body top side and the contact top side are free of the electrically insulating material at least in places in a recess of the housing body.

4. The optoelectronic lighting module according to claim 3,
   wherein at least one side wall defines the recess of the housing body in the lateral direction,
   wherein the side wall comprises a radiation-reflecting filler material, and
   wherein the electrically insulating material of the housing body surrounding the cooling body and the two contact strips in the lateral direction comprises a radiation-absorbing filler material.

5. The optoelectronic lighting module according to claim 1,
   wherein the cooling body forms an exposed side surface with the housing body,
   wherein the exposed side surface extends transverse to the common planar surface,
   wherein on the exposed side surface, the cooling body comprises a first region and a second region,
   wherein the first region is formed as an indentation in the cooling body,
   wherein the second region is formed within the first region and is coated with an attachment material, and wherein the attachment material of the second region is more strongly wettable with a connecting agent than the first region.

6. The optoelectronic lighting module according to claim 1, wherein the side wall of a recess of the housing body protrudes over the radiation outlet surface of the optoelectronic semiconductor chips by at least 20 µm.

7. The optoelectronic lighting module according to claim 1, wherein at least one of the contact strips encompasses the cooling body in the lateral direction at least in places and has a spacing of at least 100 µm with respect to the second contact strip.

8. The optoelectronic lighting module according to claim 1, wherein the optoelectronic semiconductor chips each comprise a substrate and a semiconductor layer sequence, wherein the substrate comprises a substrate material made from AlN, SiN, $Al_2O_3$ ceramic, Ge, undoped Si and/or sapphire or consists of these substrate materials and the substrate forms the electrically non-conductive back side at least in parts.

9. An optoelectronic lighting apparatus having an optoelectronic lighting module, the optoelectronic lighting module comprising:
at least two optoelectronic semiconductor chips having a radiation outlet surface and an electrically non-conductive back side facing away from the radiation outlet surface;
a cooling body with a cooling body top side and a cooling body bottom side facing away from the cooling body top side; and
two contact strips with a contact top side and a contact bottom side facing away from the contact top side;
wherein the optoelectronic semiconductor chips are disposed with the electrically non-conductive back side on the cooling body top side,
wherein each optoelectronic semiconductor chip has two electric contact points formed in the direction of the radiation outlet surface,
wherein the optoelectronic semiconductor chips are connected in series via the electric contact points,
wherein the two contact strips are spaced apart from the cooling body in a lateral direction,
wherein the contact top sides and the contact bottom sides of the two contact strips are freely accessible at least in places,
wherein the cooling body bottom side with the contact bottom sides of the two contact strips form a common planar surface and the cooling body bottom side is freely accessible at least in places,
wherein the optoelectronic lighting module is arranged on a circuit board,
wherein the circuit board comprises a thermal contact region for thermal contact of the cooling body bottom side of the optoelectronic lighting module, and the thermal contact region is completely framed on all side surfaces in the lateral direction by a solder stop layer,
wherein the cooling body bottom side is connected to the thermal contact region by a solder connection,
wherein the contact bottom sides of the two contact strips adjoin the solder stop layer at least in places, and
wherein the contact top sides of the two contact strips are electrically connected to the circuit board via two electric bridges.

10. The optoelectronic lighting apparatus according to claim 9, wherein the at least one electric bridge is formed from at least two bond wires.

11. A vehicle headlamp having at least one optoelectronic lighting module, the optoelectronic lighting module comprising:
at least two optoelectronic semiconductor chips having a radiation outlet surface and an electrically non-conductive back side facing away from the radiation outlet surface;
a cooling body with a cooling body top side and a cooling body bottom side facing away from the cooling body top side; and
two contact strips with a contact top side and a contact bottom side facing away from the contact top side;
wherein the optoelectronic semiconductor chips are disposed with the electrically non-conductive back side on the cooling body top side,
wherein each optoelectronic semiconductor chip has two electric contact points formed in the direction of the radiation outlet surface,
wherein the optoelectronic semiconductor chips are connected in series via the electric contact points,
wherein the two contact strips are spaced apart from the cooling body in a lateral direction,
wherein the contact top sides and the contact bottom sides of the two contact strips are freely accessible at least in places,
wherein the cooling body bottom side with the contact bottom sides of the two contact strips form a common planar surface and the cooling body bottom side is freely accessible at least in places, and
wherein the optoelectronic lighting module is thermally connected with its cooling body bottom side on a raised area of a heat sink, wherein regions of the heat sink, which surround the raised area in a form-fit manner in the lateral direction, are spaced apart from the optoelectronic lighting module.

* * * * *